(12) United States Patent
Zhu

(10) Patent No.: US 12,046,672 B2
(45) Date of Patent: Jul. 23, 2024

(54) SEMICONDUCTOR DEVICE AND MANUFACTURING METHOD THEREOF, AND ELECTRONIC DEVICE INCLUDING THE SEMICONDUCTOR DEVICE

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 67 days.

(21) Appl. No.: 17/112,739

(22) Filed: Dec. 4, 2020

(65) Prior Publication Data
US 2021/0175356 A1 Jun. 10, 2021

(30) Foreign Application Priority Data
Dec. 6, 2019 (CN) .......................... 201911243849.0

(51) Int. Cl.
| | |
|---|---|
| H01L 27/088 | (2006.01) |
| H01L 21/225 | (2006.01) |
| H01L 21/28 | (2006.01) |
| H01L 29/08 | (2006.01) |
| H01L 29/423 | (2006.01) |
| H01L 29/66 | (2006.01) |
| H01L 29/78 | (2006.01) |

(52) U.S. Cl.
CPC ...... *H01L 29/7827* (2013.01); *H01L 21/2254* (2013.01); *H01L 21/28114* (2013.01); *H01L 29/0847* (2013.01); *H01L 29/42376* (2013.01); *H01L 29/66553* (2013.01); *H01L 29/66666* (2013.01)

(58) Field of Classification Search
None
See application file for complete search history.

(56) References Cited

U.S. PATENT DOCUMENTS

| | | | |
|---|---|---|---|
| 9,525,064 B1 * | 12/2016 | Balakrishnan .... | H01L 29/66666 |
| 9,728,542 B1 * | 8/2017 | Balakrishnan .... | H01L 29/78642 |
| 10,014,372 B1 | 6/2018 | Leobandung | |
| 11,024,729 B2 * | 6/2021 | Afzalian ............ | H01L 29/1054 |
| 2017/0179282 A1 | 6/2017 | Balakrishnan et al. | |
| 2017/0278943 A1 * | 9/2017 | Balakrishnan .... | H01L 29/66666 |
| 2018/0090504 A1 * | 3/2018 | Balakrishnan .... | H01L 29/78642 |

(Continued)

FOREIGN PATENT DOCUMENTS

CN 110235224 A 9/2019

*Primary Examiner* — Ali Naraghi
(74) *Attorney, Agent, or Firm* — Christensen, Fonder, Dardi & Herbert PLLC

(57) ABSTRACT

The present disclosure provides a semiconductor device and a manufacturing method thereof, and an electronic device including the semiconductor device. The semiconductor device may include: a substrate; a first source/drain region, a channel region and a second source/drain region stacked sequentially on the substrate and adjacent to each other, and a gate stack formed around an outer periphery of the channel region; wherein the gate stack has a thickness varying in a direction perpendicular to a top surface of the substrate.

13 Claims, 9 Drawing Sheets

(56) References Cited

U.S. PATENT DOCUMENTS

| | | | |
|---|---|---|---|
| 2018/0358452 A1 | 12/2018 | Qi et al. | |
| 2019/0140080 A1* | 5/2019 | Lee | H01L 29/41741 |
| 2020/0251557 A1* | 8/2020 | Zhu | H01L 21/22 |
| 2022/0085043 A1* | 3/2022 | Zhu | H01L 29/42324 |

* cited by examiner

SEMICONDUCTOR DEVICE AND MANUFACTURING METHOD THEREOF, AND ELECTRONIC DEVICE INCLUDING THE SEMICONDUCTOR DEVICE

CROSS REFERENCE TO RELATED APPLICATIONS

This application claims priority to the Chinese Patent Application No. 201911243849.0 filed on Dec. 6, 2019, which is incorporated herein by reference in its entirety.

TECHNICAL FIELD

The present disclosure relates to a field of semiconductor technology, and in particular to a vertical semiconductor device and a manufacturing method thereof, and an electronic device including the semiconductor device.

BACKGROUND

Horizontal semiconductor device (such as metal oxide semiconductor field effect transistors (MOSFET)) has source electrode, gate electrode and drain electrode arranged in a direction substantially parallel to a top surface of a substrate (the horizontal direction), and thus has the problems that a size of the device in the horizontal direction is not easy to reduce and it is not conducive to improve an integration density of an electronic device or chip. The use of vertical semiconductor device may further improve the integration density. In the vertical semiconductor device, the source electrode, gate electrode and drain electrode of the transistor are arranged in a direction substantially perpendicular to the top surface of the substrate (the vertical direction), thus the vertical device has more space for optimization in the vertical direction and the size may be reduced more easily in the horizontal direction.

As the size of the vertical device shrinks and the integration density increases, resistance of the gate electrode and source/drain region increases, and parasitic capacitance between the gate electrode and the source/drain region also increases, which affects performance of the device and integrated circuit.

SUMMARY

In view of this, the present disclosure provides a semiconductor device and a manufacturing method thereof to at least partially solve the above-mentioned problems.

According to a first aspect of the present disclosure, there is provided a semiconductor device, including: a substrate; a first source/drain region, a channel region and a second source/drain region stacked sequentially on the substrate and adjacent to each other, and a gate stack formed around an outer periphery of the channel region; wherein the gate stack has a thickness varying in a direction perpendicular to a top surface of the substrate.

According to a second aspect of the present disclosure, there is provided a method of manufacturing a semiconductor device, including: forming a first material layer and a second material layer sequentially on a substrate; defining an active region of the semiconductor device on the substrate, the first material layer and the second material layer, wherein the active region comprises a channel region; forming a first spacer and a second spacer around the channel region, respectively on a top surface of the substrate and on a bottom surface of the second material layer; forming a first source/drain region and a second source/drain region respectively on the substrate and the second material layer; and forming a gate stack around an outer periphery of the channel region; wherein the gate stack has a thickness varying in a direction perpendicular to the top surface of the substrate.

According to a third aspect of the present disclosure, there is provided an electronic device including an integrated circuit formed by the above-mentioned semiconductor device.

According to embodiments of the present disclosure, by manufacturing the gate stack with the thickness varying in the direction perpendicular to the top surface of the substrate, the resistance of the gate stack is reduced, thereby reducing a voltage that needs to be applied to the gate stack during device operation, which helps reduce the power consumption of the device. By providing the spacer between the overlapping gate stack and source/drain region and completely separating the gate stack from the source/drain region with the spacer, the parasitic capacitance between the gate stack and the source/drain region is effectively reduced, which improves switching performance of the semiconductor device.

BRIEF DESCRIPTION OF THE DRAWINGS

The above and other objects, features and advantages of the present disclosure will be more apparent through the following description of embodiments of the present disclosure with reference to the drawings, in which.

Throughout the drawings, the same or similar reference numerals indicate the same or similar composite parts.

DETAILED DESCRIPTION

Figure 1A:
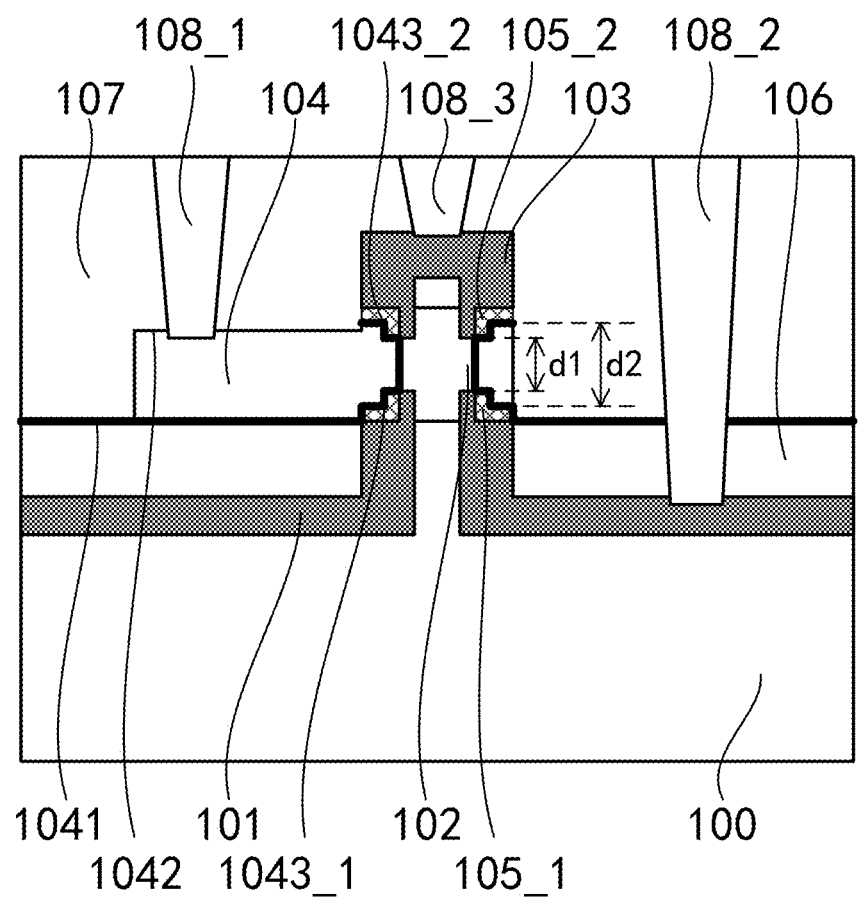
FIG. 1A shows a schematic structural diagram of a semiconductor device according to an embodiment of the present disclosure.

Embodiments of the present disclosure will be described below with reference to the drawings. It should be understood, however, that these descriptions are merely exemplary and are not intended to limit the scope of the present disclosure. In addition, in the following description, descriptions of well-known structures and technologies are omitted to avoid unnecessarily obscuring the concepts of the present disclosure.

Various schematic structural diagrams according to the embodiments of the present disclosure are shown in the drawings. The figures are not drawn to scale. Some details are enlarged and some details may be omitted for clarity of presentation. The shapes of the various regions and layers shown in the figures as well as the relative size and positional relationship thereof are only exemplary. In practice, there may be deviations due to manufacturing tolerances or technical limitations, and those skilled in the art may additionally design regions/layers with different shapes, sizes and relative positions according to actual needs.

In the context of the present disclosure, when a layer/element is referred to as being "on" another layer/element, the layer/element may be directly on another layer/element, or there may be an intermediate layer/element between them. In addition, if a layer/element is located "on" another layer/element in one orientation, the layer/element may be located "under" another layer/element when the orientation is reversed.

FIG. 1A shows a schematic structural diagram of a semiconductor device according to an embodiment of the present disclosure. As shown in FIG. 1A, a vertical semiconductor device according to the embodiment of the present disclosure may include a substrate 100, and a first source/drain region 101, a channel region 102 and a second source/drain region 103 stacked sequentially on the substrate and adjacent to each other. A gate stack 104 is formed around an outer periphery of the channel region 102. Therefore, a gate length of the device is related to a thickness of the channel region 102, and may be determined by the thickness of the channel region 102 without relying on etching. In this way, processing time may be saved, and the gate length of the device may be more effectively controlled by controlling the thickness of the channel region 102. According to the embodiment, the channel region 102 may be formed by a growth process such as epitaxial growth, and thus the thickness of the channel region 102 may be controlled well, and accordingly the gate length of the device formed may be controlled well.

According to an embodiment of the present disclosure, the gate stack 104 has a thickness varying in a direction perpendicular to a top surface of the substrate 100 (i.e., the vertical direction). According to some embodiments, the thickness of the gate stack 104 increases in a direction parallel to the top surface of the substrate 100 (i.e., the horizontal direction) from an interface between the gate stack 104 and the channel region 102. As shown in FIG. 1A, the gate stack 104 has a thickness d1 at the interface between the gate stack 104 and the channel region 102. The gate stack 104 extends in the horizontal direction and has a thickness d2 at a certain distance from the interface between the gate stack 104 and the channel region 102, where the thickness d2>d1 According to the embodiment of the present disclosure, due to the increase in the thickness of the gate stack 104, the gate stack 104 can include more carriers. In this way, only a small voltage needs to be applied to the gate stack 104 to form an electric field in the gate stack 104 so as to form a set gate control. In other words, since the thickness of the gate stack 104 in the horizontal direction increases, the resistance of the gate stack 104 is reduced, which is beneficial to reduce the gate voltage applied during the device operation, thereby reducing the power consumption of the device and improving the performance of the device.

According to an embodiment of the present disclosure, the gate stack 104 has a stepped structure. As shown in FIG. 1A, the gate stack 104 may have a first step 1043_1 extending toward the first source/drain region 101, and the gate stack 104 may have a second step 1043_2 extending toward the second source/drain region 103. According to an embodiment, the first step 1043_1 and the second step 1043_2 may be provided at the same time, or only the first step 1043_1 or the second step 1043_2 is provided, which is not limited in the present disclosure.

According to an embodiment of the present disclosure, a first spacer 105_1 is provided between the gate stack 104 and the first source/drain region 101, and a second spacer 105_2 is provided between the gate stack 104 and the second source/drain region 103. Both the first spacer 105_1 and the second spacer 105_2 are arranged to surround the outer periphery of the channel region 102.

According to an embodiment of the present disclosure, the first spacer 105_1 covers the first step 1043_1 so as to completely separate the gate stack 104 from the first source/drain region 101, and the second spacer 105_2 covers the second step 1043_2 so as to completely separate the gate stack 104 from the second source/drain region 103. As shown in FIG. 1A, the first spacer 105_1 and the second spacer 105_2 are conformally formed on the first step 1043_1 and the second step 1043_2 respectively. According to some embodiments of the present disclosure, the first spacer 105_1 and the second spacer 105_2 each may have a transverse "L" shaped cross section in the vertical direction.

In the vertical semiconductor device structure shown in FIG. 1A, the gate stack 104 includes two parts, including a gate dielectric layer 1041 and a gate conductor layer 1042. The gate dielectric layer 1041 generally includes a high-k gate dielectric (such as $SiO_2$ and $HfO_2$) or oxide, and the gate conductor layer 1042 generally includes a gate conductor formed of a metal material. As shown in FIG. 1A, the gate dielectric layer 1041 is located between the gate conductor layer 1042 and the first source/drain region 101 and between the gate conductor layer 1042 and the second source/drain region 103, which is equivalent to that a capacitance is formed in the overlap portion of the gate stack 104 and the first source/drain region 101 and the overlap portion of the gate stack 104 and the second source/drain region 103. That is to say, a parasitic capacitance exists in the overlap portion of the gate stack 104 and the first source/drain region 101 and the overlap portion of the gate stack 104 and the second source/drain region 103. The parasitic capacitance may affect the build-up time of the internal current of the semiconductor device, which is manifested as an increase in a delay of the on time of the semiconductor device, thereby affecting the switching performance of the device.

To solve this problem, in an embodiment of the present disclosure, the first spacer 105_1 and the second spacer 105_2 are respectively disposed between the gate stack 104 and the first source/drain region 101 and between the gate stack 104 and the second source/drain region 103. According to the embodiment of the present disclosure, the first spacer 105_1 and the second spacer 105_2 may be formed of a material with a low dielectric constant, which is equivalent to increasing a distance between the parasitic capacitances of the overlap portion of the gate stack 104 and the first source/drain region 101 and the overlap portion of the gate stack 104 and the second source/drain region 103, and also reducing the dielectric constant of the filled dielectric, so that the magnitude of the parasitic capacitance can be reduced. As shown in FIG. 1A, the first spacer 105_1 and the second spacer 105_2 completely separate the gate stack 104 from the first source/drain region 101 and the second source/drain region 103, which may speed up the build-up of internal current of the semiconductor device, reduce the delay of the on time of the device, and significantly improve the switching performance of the device.

According to the embodiment of the present disclosure, a self-alignment of the first spacer 105_1 and the second spacer 105_2 with the gate stack 104 may be achieved, thereby improving manufacturing accuracy of the device and facilitating mass production of the device. As shown in FIG. 1A, a recess for accommodating the gate stack 104, the first spacer 105_1 and the second spacer 105_2 is formed by selectively etching a material layer of the stack structure including the semiconductor material layer forming the channel region 102. Therefore, an upper surface and a lower surface in the formed recess are substantially coplanar with an interface between the material layer forming the channel region 102 and the material layer forming the second source/drain region 103 and an interface between the material layer forming the channel region 102 and the first source/drain region 101, respectively.

Figure 1B:
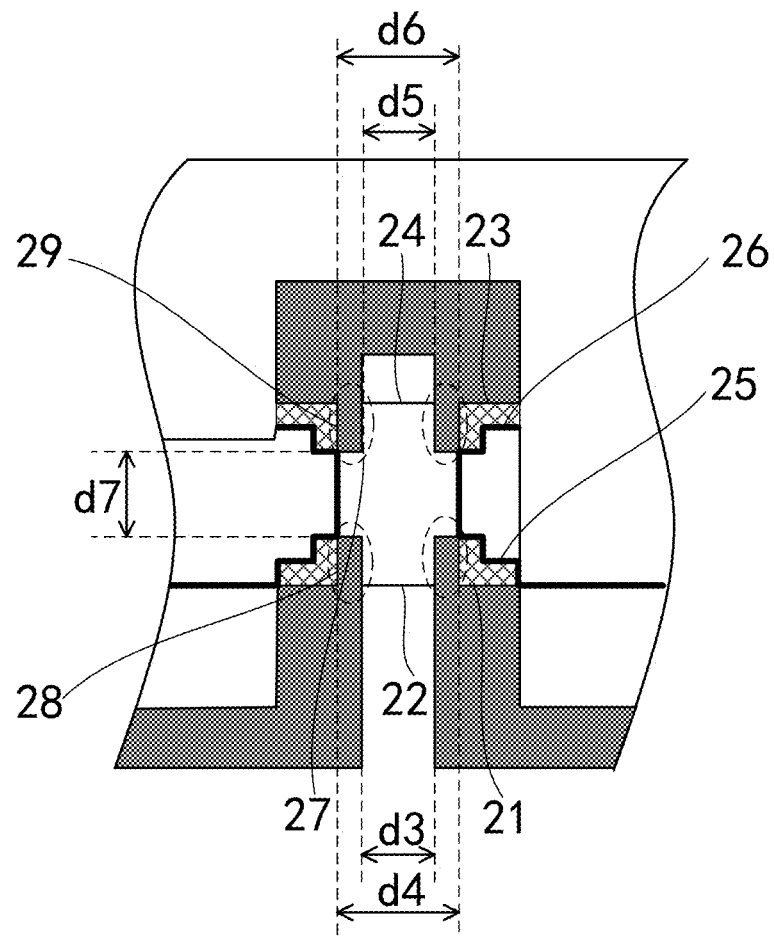
FIG. 1B shows a partially enlarged schematic diagram of a semiconductor device according to an embodiment of the present disclosure.

A part of the structure including the channel region 102 in FIG. 1A is enlarged and shown in FIG. 1B. With reference to FIGS. 1A and 1B, a lower surface 21 of the first spacer 105_1 is substantially coplanar with an interface between the material layer forming the channel region 102 and the material layer forming the first source/drain region 101, and an upper surface 23 of the second spacer 105_2 is substantially coplanar with an interface between the material layer forming the channel region 102 and the material layer forming the second source/drain region 103. That is to say, the first spacer 105_1 and the second spacer 105_2 are well aligned with the channel region 102.

As shown in FIGS. 1A and 1B, according to the embodiment of the present disclosure, a lower surface 25 of the first step 1043_1 is substantially parallel to the interface between the material layer forming the channel region 102 and the material layer forming the first source/drain region 101, and an upper surface 26 of the second step 1043_2 is substantially parallel to the interface between the material layer forming the channel region 102 and the material layer forming the second source/drain region 103. That is to say, the gate stack 104 is well aligned with the channel region 102.

According to an embodiment of the present disclosure, the first source/drain region 101 and the second source/drain region 103 are formed by a diffusion doping process. Doped regions of the first source/drain region 101 and the second source/drain region 103 thus formed (shown as the deepened parts in FIG. 1A) are located in shallow layers of the surfaces of the source/drain regions (for example, in a shallow layer with a doping concentration of 1E19 $cm^{-3}$~1E21 $cm^{-3}$). As shown in FIG. 1A, the doped regions of the first source/drain region 101 and the second source/drain region 103 formed by diffusion doping extend along the outer surfaces of the first source/drain region 101 and the second source/drain region 103, respectively.

According to an embodiment, a portion of the doped regions of the first source/drain region 101 and the second source/drain region 103 overlaps the channel region 102. As shown in FIG. 1B, an overlap area 27 is shown in a dashed frame, and the overlap area 27 is formed by controlling the diffusion doping process in the source/drain regions so that a leading edge of the dopant is diffused into the channel region 102.

As shown in FIG. 1B, a first inner side surface 28 of the first spacer 105_1 located inside the active region (including the first source/drain region 101, the channel region 102 and the second source/drain region 103) is substantially coplanar with the interface between the gate stack 104 and the channel region 102, and a second inner side surface 29 of the second spacer 105_2 located inside the active region is substantially coplanar with the interface between the gate stack 104 and the channel region 102. To ensure this overlap, it is necessary that a distance d3 between an interface between the doped region of the first source/drain region 101 and the channel region 102 and another interface between the doped region of the first source/drain region 101 and the channel region 102 is less than a distance d4 between the first inner side surfaces 28, and a distance d5 between an interface between the doped region of the second source/drain region 103 and the channel region 102 and another interface between the doped region of the second source/drain region 103 and the channel region 102 is less than a distance d6 between the second inner side surfaces 29, and that a distance d7 between the interface between the doped region of the first source/drain region 101 and the channel region 102 and the interface between the doped region of the second source/drain region 103 and the channel region is equal to or less than a minimum thickness of the gate stack 104 determined by the interface between the gate stack 104 and the channel region 102. As shown in FIG. 1B, the overlap area 27 may further extend into the channel region in the vertical direction, so that the distance d7 is less than the minimum thickness of the gate stack 104 determined by the interface between the gate stack 104 and the channel region 102. According to the embodiment, it should be ensured that the distance d7 is not greater than the minimum thickness of the gate stack 104 determined by the interface between the gate stack 104 and the channel region 102 so as to ensure that the carriers in the first source/drain region 101 and the second source/drain region 103 can enter the conductive channel more easily to form current under the control of the gate stack.

According to the embodiment of the present disclosure, the gate resistance of the semiconductor device may be effectively reduced, thereby reducing the gate control voltage. Moreover, the on time and off time of the semiconductor device may be reduced, thereby improving the switching performance of the device. In addition, the semiconductor device according to the embodiment of the present disclosure can be self-aligned during the manufacturing process, which is beneficial to the mass production of the device.

It can also be seen from FIG. 1A that only the upper portion of the substrate 100 is etched, and the lower portion of the substrate 100 may extend beyond the outer periphery of the upper portion. Such a structure may facilitate formation of connections of the source/drain regions in the subsequent process. As shown in FIG. 1A, the semiconductor device further includes via holes respectively exposing the gate stack 104, the first source/drain region 101 and the second source/drain region 103, in which a contact portion 108_1 for connecting the gate stack 104, a contact 108_2 for connecting the first source/drain region 101 and a contact 108_3 for connecting the second source/drain region are formed respectively. In addition, an isolation layer 106 is further formed on a top surface of a lower region of the first source/drain region 101 beyond an outer periphery of the upper portion of the first source/drain region 101. A top surface of the isolation layer 106 is close to the surface of the first source/drain region 101 which is adjacent to (substantially coplanar with) the channel region 102. An interlayer dielectric layer 107 is further formed on the top of the semiconductor device for isolation and protection of the device.

According to an embodiment of the present disclosure, the channel region 102 may be formed of a single crystal semiconductor material, and the channel region 102 may include a semiconductor material different from that of the first source/drain region 101 and the second source/drain region 103. In this way, it is advantageous to process (for example, selectively etch) the channel region 102 when defining the active region, so as to form the recess for embedding the gate stack. The channel region 102 may be formed by an epitaxial growth process or a molecular beam epitaxy (MBE) process. The epitaxial growth process is preferably a low temperature epitaxial growth process.

The present disclosure may be presented in various forms, some examples of which will be described below.

FIGS. 2-13 show schematic diagrams of a process of manufacturing a semiconductor device according to an embodiment of the present disclosure. The process will be described in detail below with reference to the drawings.

Figure 2:
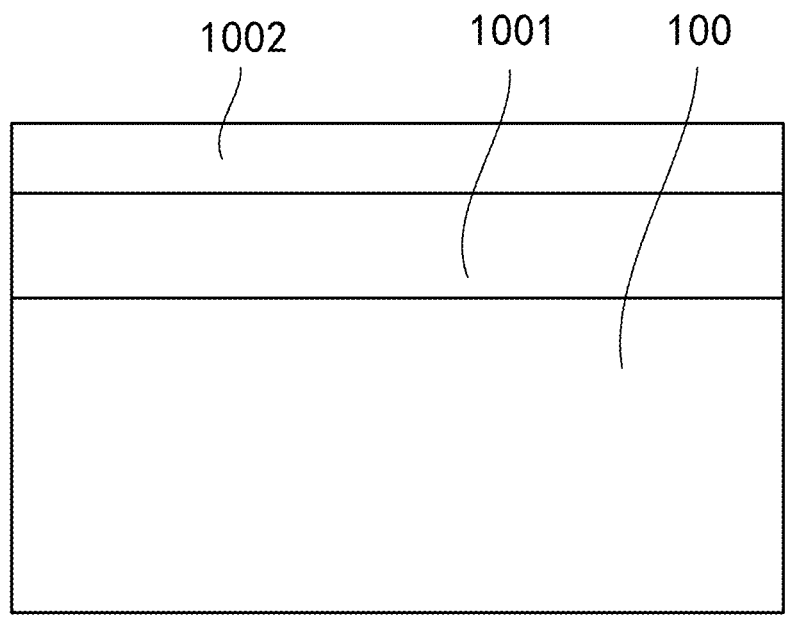
FIGS. 2-13 show schematic diagrams of a process of manufacturing a semiconductor device according to an embodiment of the present disclosure.

As shown in FIG. 2, the substrate 100 is provided. The substrate 100 may be in various forms, including but not limited to bulk semiconductor material substrate such as bulk Si substrate, semiconductor-on-insulator (SOI) substrate, compound semiconductor substrate such as SiGe substrate, and the like. For ease of description, in the embodiments of the present disclosure, a bulk Si substrate is taken as an example for description. The substrate 100 may be used to form the first source/drain region 101.

On the substrate 100, a first material layer 1001 and a second material layer 1002 may be formed sequentially. In a specific embodiment, the first material layer 1001 and the second material layer 1002 may be formed sequentially by an epitaxial growth process.

According to the embodiment, the first material layer 1001 is first formed on the provided substrate 100 by epitaxial growth. The first material layer 1001 may be used to form the channel region 102. The thickness of the channel region 102 may be used to define the thickness of the gate stack (i.e., the gate length). In an embodiment of the present disclosure, the first material layer 1001 may be a SiGe material layer with a thickness of about 10 nm~100 nm and a Ge content of about 10%~40%. Then, the second material layer 1002 is formed on the first material layer 1001 by epitaxial growth, and the second material layer 1002 may be used to form the second source/drain region 103. In an embodiment of the present disclosure, the second material layer 1002 may be a Si material layer with a thickness of about 30 nm~100 nm. It should be noted that the present disclosure is not limited to this, and the type and thickness of the above-mentioned material layer may be changed. For example, when the above three material layers are formed by an epitaxial growth process, it is only necessary to ensure that the first material layer 1001 has a larger etch selectivity ratio than the material of the substrate 100 and the second material layer 1002.

In the embodiment of the present disclosure, it is preferable to use an epitaxial growth process or a molecular beam epitaxy process to form each material layer. The epitaxial growth process preferably adopts a low-temperature epitaxial growth process. The formation of each material layer by the epitaxial growth process can well control the thickness of the material layer of the channel region 102. The thickness of the channel region 102 determines the size of the recess for accommodating the spacers and the gate stack, and may be used to perform self-alignment of the spacers and the gate stack with the channel region 102, thereby improving the processing accuracy of the device. In addition, in an embodiment of the present disclosure, the channel region 102 uses a single crystal semiconductor material, which is beneficial to reduce the resistance of the device.

Figure 3A:
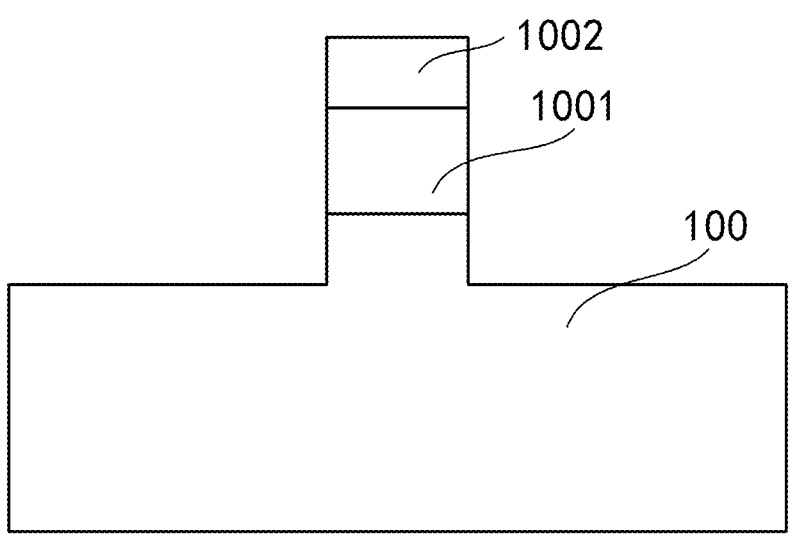
Figure 3B:
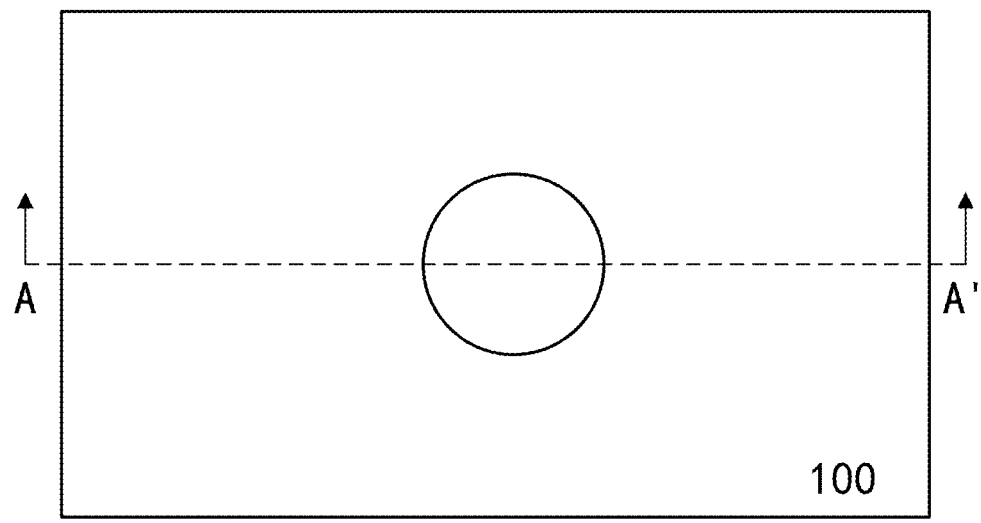

Next, the active region of the device may be defined. The active region of the device includes the first source/drain region 101, the channel region 102 and the second source/drain region 103. The defining the active region mainly refers to restricting the shape of the active region. Specifically, as shown in FIGS. 3A and 3B (wherein FIG. 3A is a cross-sectional view, FIG. 3B is a top view, and the line AA' in FIG. 3B shows the cutting position of the cross-section), a photoresist (not shown) may be formed on the stack of the substrate 100, the first material layer 1001 and the second material layer 1002 shown in FIG. 2. The photoresist is patterned into a desired shape by photolithography (exposure and development), and the patterned photoresist is used as a mask to perform selective etching (for example, reactive ion etching (RIE)) sequentially on the second material layer 1002, the first material layer 1001 and a part of the substrate 100. The etching proceeds to the upper portion of the substrate 100. The etched second material layer 1002, first material layer 1001 and upper portion of the substrate 100 form a columnar shape. RIE, for example, may be performed in a direction substantially perpendicular to the top surface of the substrate 100, so that the columnar shape is also substantially perpendicular to the top surface of the substrate 100. After the etching is completed, the photoresist is removed.

It can be seen from the top view of FIG. 3B that, in this embodiment, the cross section of the active region is substantially circular, that is, the outer periphery of the active region is substantially cylindrical. A radius of the circular cross section may preferably be 10 nm~30 nm. In other embodiments, the active region may have other shapes. When the cross section of the active region is a square, a side length of the square may preferably be 10 nm~30 nm. When the cross section of the active region is a rectangular, a width of the rectangle (along the vertical direction of the plane of FIG. 3B) may preferably be 10 nm~30 nm, and a length of the rectangle (along the horizontal direction of the plane of FIG. 3B) is determined by the magnitude of the device current. Such a structure helps to improve the mobility, not only can provide sufficient device current, but also can better control the short channel effect and optimize the performance of the device. Of course, the shape of the active region is not limited to this, but can be designed according to the layout. For example, the cross section of the active region may be oval, polygonal, or the like.

Figure 4:
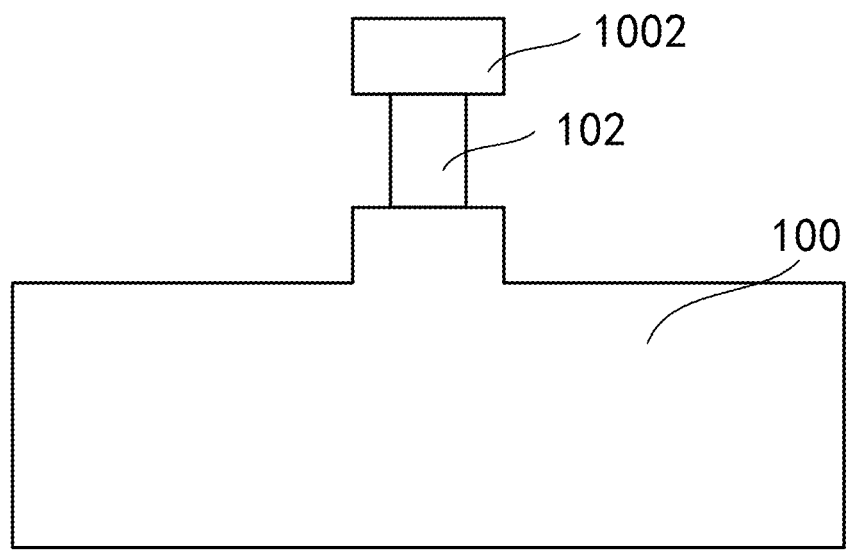

Next, as shown in FIG. 4, the first material layer 1001 in FIG. 3A is recessed inward with respect to the columnar active region (that is, in a direction opposite to the normal direction of the outer peripheral surface of the columnar active region) so as to form the channel region 102. This may be achieved by selectively etching the first material layer 1001 relative to the substrate 100 and the second material layer 1002. A modifier may be used at least once to form a modified layer on a surface including the surface to be etched, and the formed modified layer may be etched at least once to form a predetermined structure on the surface to be etched.

According to an embodiment, the entire stack structure formed in the foregoing process steps is first put into a surface modifier. Through the reaction between the modifier and the semiconductor material, a modified layer in oxide form is formed on the surface of the substrate 100, the first material layer 1001 and the second material layer 1002. If the material of the substrate 100 and the second material are Si, and the first material is SiGe, then SiGe has a faster oxidation rate than Si, and the formed oxide (for example, SiGeO formed on the SiGe surface) is easier to remove. Generally, after the modified layer is formed, the semiconductor surface on which the modified layer is formed is cleaned. Then, the modified layer is removed with an etchant and the semiconductor surface where the modified layer has been removed is cleaned. Since the first material layer 1001 has a faster oxidation rate, the first material layer 1001 forms a recess relative to the substrate 100 and the second material layer 1002 after the modified layer is removed. Then, it is checked whether the etching reaches a preset depth. If it has not reached the preset depth, the above process steps of forming the modified layer with the modifier and etching the modified layer are repeated until the preset depth and etching requirement are reached. The method may accurately control the etching thickness ($\leq 0.5$ nm) during semiconductor processing, and also increase the etching rate. The etched stack structure is shown in FIG. 4, where the first material layer 1001 recessed inwardly serves as the channel region 102 of the device, and the recessed structure surrounds the outer periphery of the channel region 102.

The modifier used may include but is not limited to liquid or aqueous solutions of one or a combination of ozone ($O_3$), potassium permanganate ($KMnO_4$), potassium dichromate ($K_2Cr_2O_7$), nitric acid ($HNO_3$), sulfuric acid ($H_2SO_4$), hydrogen peroxide ($H_2O_2$), oxygen-containing gas or oxygen-containing plasma. The etchant used may include but is not limited to hydrofluoric acid, buffered hydrofluoric acid, BOE, hydrofluoric acid vapor, halogen hydride or vapors thereof. The cleaning agent used may include but is not limited to water, high-purity deionized water, ethanol, acetone, and the like.

According to other embodiments, the channel region 102 may also be formed by atomic layer etching. Hydrogen (H) ions or helium (He) ions may be used to process the first material (for example, SiGe) layer to form the modified layer on the surface of the first material layer. Then, the modified layer is removed by wet etching or using free radical materials (such as $NH_3$, $NF_3$, etc. in an active state). Similarly, the steps of forming the modified layer and removing the modified layer may be repeated until the recess with a predetermined depth is obtained.

Figure 5:
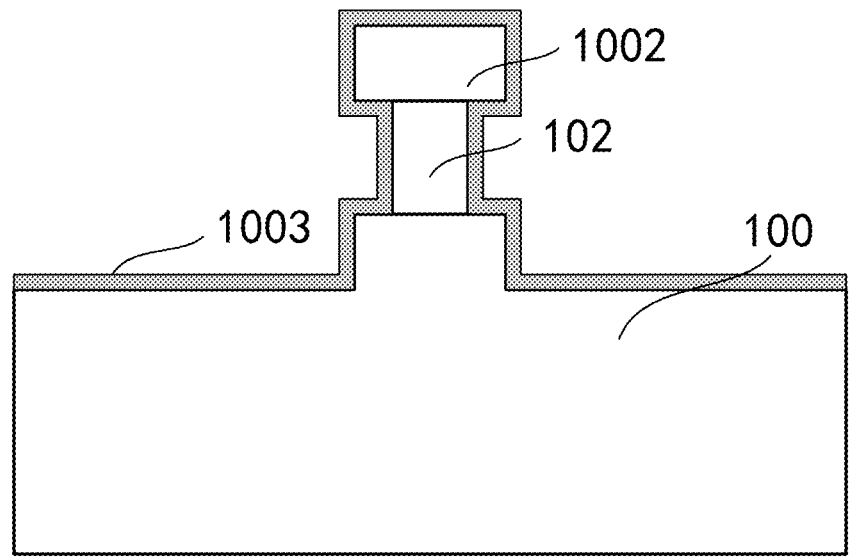

Next, the first spacer 105_1 and the second spacer 105_2 are formed around the channel region 102 on the top surface of the substrate 100 and the bottom surface of the second material layer 1002 respectively. First, as shown in FIG. 5, a third material layer 1003 is formed on the top surface of the substrate 100, the outer surface of the second material layer 1002 and the outer peripheral surface of the channel region 102. According to an embodiment, the third material layer 1003 may be formed by depositing on the top surface of the substrate 100, the outer surface of the second material layer 1002 and the outer peripheral surface of the channel region 102 or by an epitaxial growth process. The material forming the third material layer 1003 needs to have a larger etch selectivity ratio than the material forming the substrate 100, the channel region 102 (the first material layer 1001) and the second material layer 1002. According to an embodiment, the third material layer 1003 may use SiGe with a Ge percentage greater than that of the first material layer (SiGe). According to the embodiment, the third material layer 1003 may also use a material having an oxidation rate greater than that of the material forming the substrate 100 and the second material layer 1002, such as Ge. The embodiment of the present disclosure is not limited to this, and other materials may be used, as long as the etch selectivity of the third material layer 1003 relative to the substrate 100, the channel region 102 and the second material layer 1002 is ensured.

Figure 6:
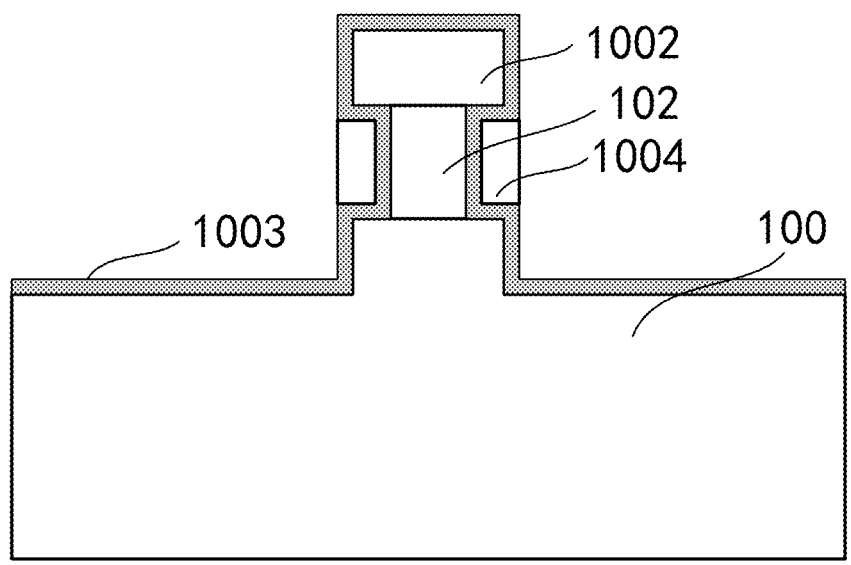

Next, a sacrificial layer 1004 is formed in the recess formed in FIG. 5. In a specific embodiment, a material layer for forming the sacrificial layer 1004 is first deposited on the structure shown in FIG. 5. Then, an etching back such as RIE is performed on the deposited material layer to form the sacrificial layer 1004, and the direction of the etching back is substantially perpendicular to the top surface of the substrate 100. The sacrificial layer 1004 formed is filled in the recess, and the outer peripheral surface of the sacrificial layer 1004 is substantially coplanar with the outer peripheral surface of the columnar active region, as shown in FIG. 6. According to an embodiment, the material forming the sacrificial layer 1004 needs to have a lower etch selectivity ratio than the third material layer 1003, so that the third material layer 1003 can be selectively etched in subsequent steps. In a specific embodiment, the third material layer 1003 may be nitride, but the present disclosure is not limited thereto.

Figure 7:
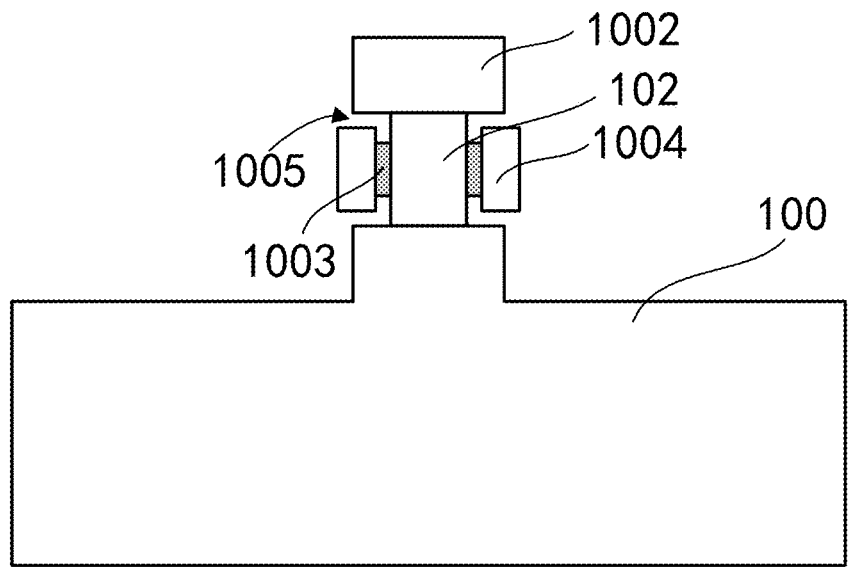

Next, the third material layer 1003 is selectively etched relative to the substrate 100, the channel region 102, the second material layer 1002 and the sacrificial layer 1004, so as to form trenches for accommodating the spacers, as shown in FIG. 7. The process steps of selectively etching the third material layer 1003 may be obtained by referring to the process steps of selectively etching the first material layer to form the channel region 102. Preferably, atomic layer etching is used in order to better control the size of the etching. After the etching, trenches 1005 each having a transverse L-shaped cross section are formed between the substrate 100, the sacrificial layer 1004 and the remaining unetched third material layer 1003 and between the second material layer 1002, the sacrificial layer 1004 and the remaining unetched third material layer 1003 respectively, as shown in FIG. 7.

Figure 8:
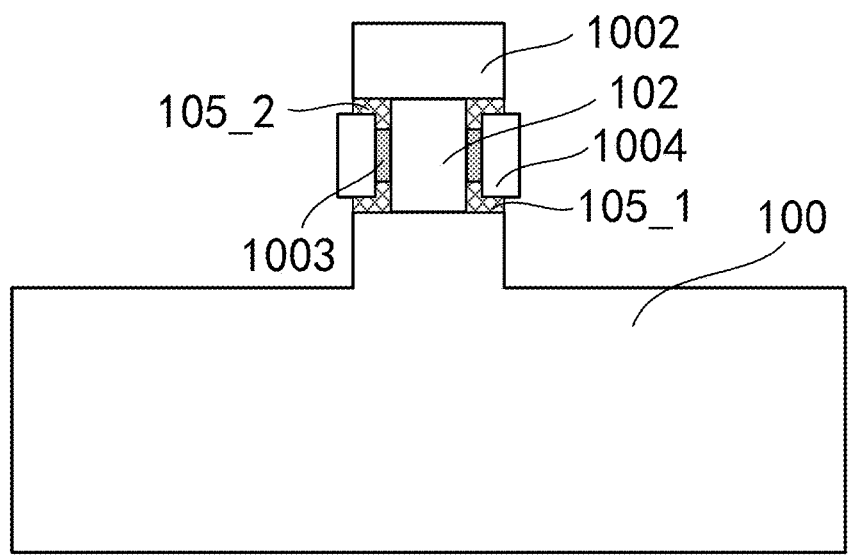

Next, the first spacer 105_1 and the second spacer 105_2 are formed in the trenches 1005, as shown in FIG. 8. In a specific embodiment, a material layer for forming the first spacer 105_1 and the second spacer 105_2 is first deposited on the structure shown in FIG. 7. Then, the etching back such as RIE is performed on the deposited material layer to form the first spacer 105_1 and the second spacer 105_2. According to an embodiment, the first spacer 105_1 and the second spacer 105_2 are formed of a material with a low dielectric constant, including but not limited to SiC, SiON, nitride, and the like. It should be noted that, when the sacrificial layer 1004 is subsequently removed, it is necessary to ensure the etch selectivity of the material of the first spacer 105_1 and the second spacer 105_2 relative to the sacrificial layer 1004. Therefore, if the sacrificial layer 1004 is formed of nitride, nitride cannot be used to form the first spacer 105_1 and the second spacer 105_2. Alternatively, if the first spacer 105_1 and the second spacer 105_2 are formed of nitride, the sacrificial layer 1004 may be formed of, for example, silicon oxide.

As shown in FIG. 8, the first spacer 105_1 and the second spacer 105_2 formed are filled in the trenches 1005, thus the first spacer 105_1 and the second spacer 105_2 also have a transverse L-shaped cross section. Moreover, this process step can ensure that the lower surface of the first spacer 105_1 and the upper surface of the second spacer 105_2 are coplanar with the interface between the substrate 100 and the channel region 102 (that is, the first material layer 1001) and the interface between the second material layer 1002 and the channel region 102 respectively, thus achieving self-alignment of the first spacer 105_1 and the second spacer 105_2 with the channel region 102.

It should also be noted that since the sacrificial layer 1004 and the remaining unetched third material layer 1003 will be removed in the subsequent steps, the material forming the first spacer 105_1 and the second spacer 105_2 needs to have etch selectivity relative to the material forming the sacrificial layer 1004 and the third material layer 1003.

Figure 9:
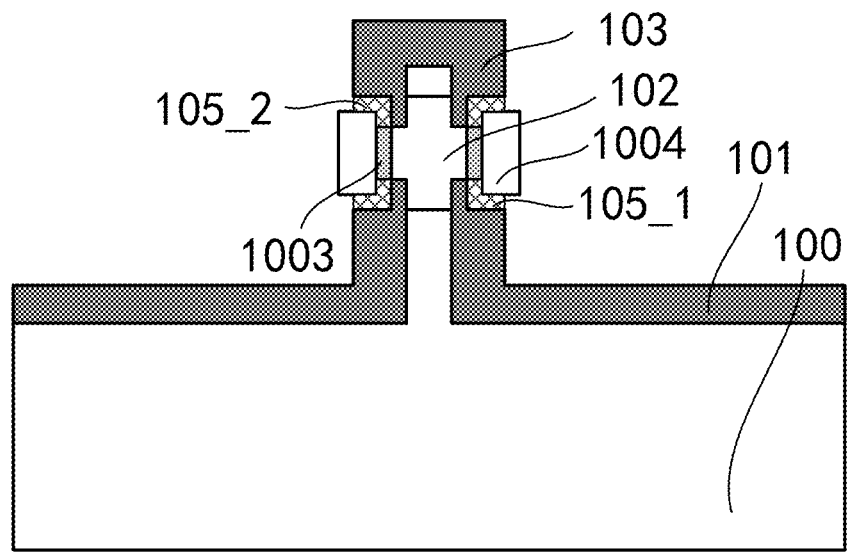

Next, the first source/drain region 101 and the second source/drain region 103 are formed on the substrate 100 and the second material layer 1002 respectively. In a specific embodiment, a dopant film is first deposited on the outer surface of the columnar active region at least including the surface of the upper portion of the substrate 100 and the outer surface of the second material layer 1002 shown in FIG. 8. The dopant film formed surrounds the outer surfaces of the substrate 100, the sacrificial layer 1004, the first and second spacers 105_1 and 105_2, and the second material layer 1002. According to an embodiment, the dopant film may be deposited by the process such as chemical vapor deposition (CVD), atomic layer deposition (ALD), or plasma doping. For an n-type semiconductor device, an n-type dopant film may be used, and for a p-type semiconductor device, a p-type dopant film may be used. Then, the dopant film is used as a solid phase diffusion source, and an annealing process is adopted to drive in a diffusion of the dopant of the dopant film so as to form the doped first source/drain region and second source/drain region. Generally, the doped region is a doped area with a doping concentration of $5E18$ cm$^{-3}$~$1E19$ cm$^{-3}$. As shown in FIG. 9, the doped region of the first source/drain region 101 is formed in a shallow layer of the upper portion of the substrate 100 around the outer peripheral surface of the active region and in a shallow layer of the top surface of the lower portion of the substrate 100. The doped region of the second source/drain region 103 is formed in a shallow layer of the outer surface of the second material layer 1002. Both the first source/drain region 101 and the second source/drain region 103 are source/drain regions with a relatively shallow junction depth, which is beneficial to improve a short channel effect of the device. After the doping diffusion process is completed, the dopant film is removed.

According to an embodiment of the present disclosure, when annealing to drive in the diffusion of the dopant film, the process of the diffusion is controlled to diffuse a leading edge of the dopant into the channel region 102, so that a portion of the doped regions of the first source/drain region 101 and the second source/drain region 103 overlaps the channel region 102. Referring to FIG. 1B, the internal interfaces of the doped regions of the first source/drain region 101 and the second source/drain region 103 perpendicular to the top surface of the substrate 100 respectively exceed the inner side surfaces of the first spacer 105_1 and the second spacer 105_2 closest to a center of the channel region 102. That is, the distance d3 of the interface between the doped region of the first source/drain region 101 and the channel region 102 is less than the distance d4 of the first inner side surface 28, and the distance d5 of the interface between the doped region of the second source/drain region 103 and the channel region 102 is less than the distance d6 of the second inner side surface 29. At the same time, the internal interfaces of the doped regions of the first source/drain region 101 and the second source/drain region 103 parallel to the top surface of the substrate 100 are substantially coplanar with a contact surface between the first spacer 105_1 and the remaining unetched third material layer 1003 and a contact surface between the second spacer 105_2 and the remaining unetched third material layer 1003 respectively, or exceed the corresponding contact surfaces. That is, the distance d7 between the interface between the doped region of the first source/drain region 101 and the channel region 102 and the interface between the doped region of the second source/drain region 103 and the channel region 102 is equal to or less than the minimum thickness of the gate stack 104 determined by the interface between the gate stack 104 and the channel region 102. As a result, the channel resistance may be reduced, thereby improving the device performance.

Figure 10:
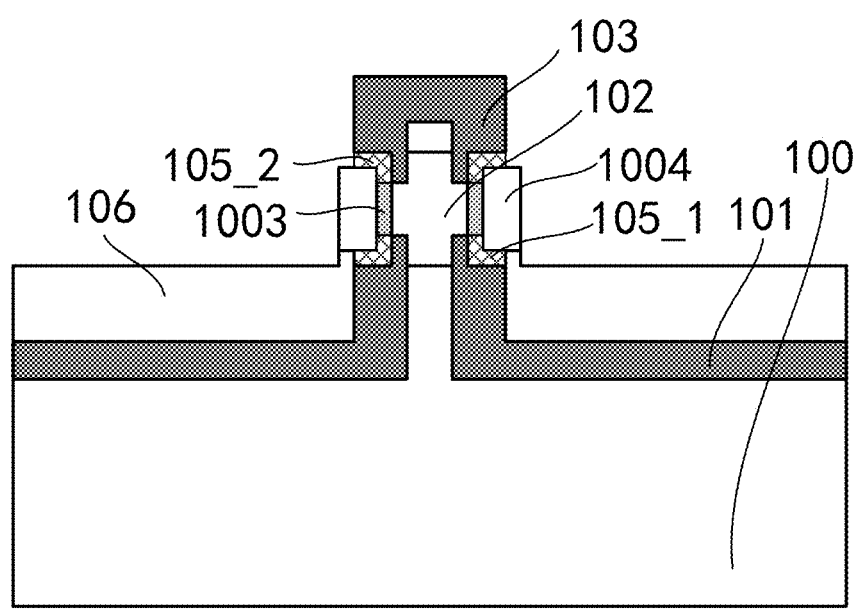

Next, the isolation layer may be formed around the active region to achieve an electrical isolation. As shown in FIG. 10, an oxide may be deposited on the top surface of the lower portion of the substrate 100, and etching back is performed on the deposited oxide so as to form the isolation layer 106. The etching back stops at the contact surfaces of the first source/drain region 101 exposed from the outer peripheral surface of the active region with the first spacer 105_1 and the second spacer 105_2. In this way, the top surface of the isolation layer 106 formed may be substantially coplanar with the interface between the material layer forming the channel region 102 and the material layer forming the first source/drain region 101. Prior to the etching back, a planarization such as chemical mechanical polishing (CMP) or sputtering may be performed on the deposited oxide.

In some embodiments of the present disclosure, prior to forming the above-mentioned isolation layer, silicidation of source/drain electrode may be performed to reduce resistance. The silicidation of source/drain electrode refers to forming a layer of metal silicide on the substrate 100 prior to forming the isolation layer. In a specific embodiment, Ni or NiPt may be deposited on the substrate 100 first, and NiSi or NiPtSi may be formed by annealing, and then the unreacted metal may be removed.

When forming the isolation layer 106, the sacrificial layer 1004 may be retained to prevent the material of the isolation layer 106 from entering the recess for accommodating the gate stack. After that, the sacrificial layer 1004 and the remaining unetched third material layer 1003 may be removed sequentially so as to release the space in the recess, and the recess formed has a stepped cross section. According to an embodiment, the sacrificial layer 1004 and the remaining unetched third material layer 1003 may be removed by selectively etching the materials of the sacrificial layer 1004 and the third material layer 1003. For example, the sacrificial layer 1004 may be removed by selectively etching the material of the sacrificial layer 1004 (for example, nitride) relative to the material of the first spacer 105_1 and the second spacer 105_2 (for example, SiC) and the material of the third material layer 1003 (for example, SiGe). The remaining unetched third material layer 1003 may be removed by selectively etching the material of the third material layer 1003 relative to the material of the first spacer 105_1 and the second spacer 105_2 (for example, SiC) and the material of the channel region 102 (for example, SiGe with a different Ge percentage from the material of the third material layer 1003).

Figure 11:
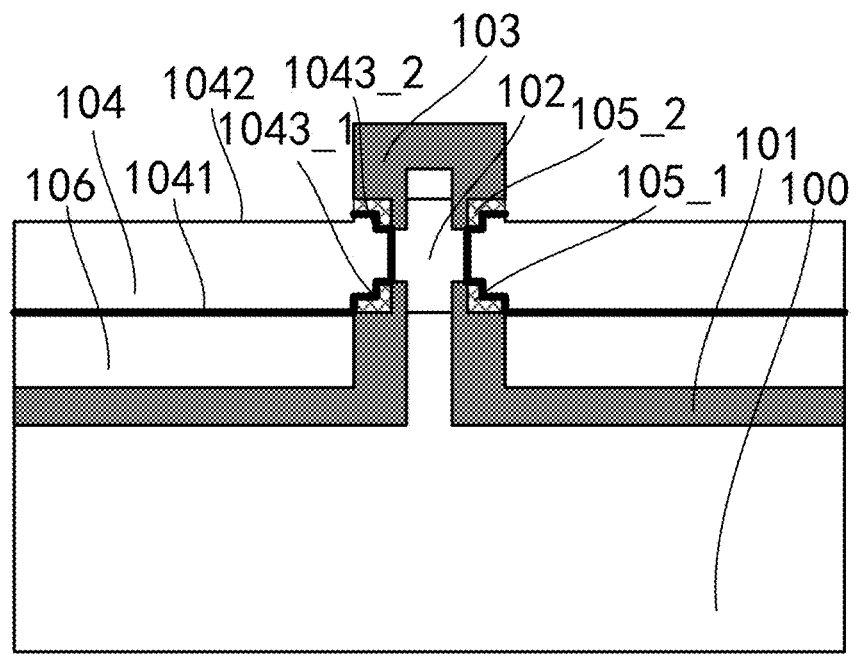

Next, the gate stack 104 is formed around the outer periphery of the channel region 102. As shown in FIG. 11, the gate dielectric layer 1041 and the gate conductor layer 1042 may be deposited sequentially on the structure shown in FIG. 10 (in which the sacrificial layer 1004 and the third material layer 1003 have been removed), and the gate stack 104 may be formed by etching the gate conductor 1042. The gate dielectric layer 1041 may include an interface layer (such as $SiO_2$) and a high-k material layer (such as $HfO_2$). In a specific embodiment, an ALD process may be used to form or deposit a $SiO_2$ layer (about 0.2 nm~1.5 nm) and deposit an $HfO_2$ layer (about 1 nm~5 nm) on the top surface of the isolation layer 106 and in the recess. When etching the gate conductor layer 1042, it is preferable to control the top surface of the gate conductor layer 1042 between the upper surface and the lower surface of the second spacer 105_2 exposed from the outer peripheral surface of the active region. This is beneficial to reduce the capacitance between the formed gate stack 104 and the second source/drain region 103. As shown in FIG. 11, by filling the recesses to form the gate stack 104, it is possible to obtain the first step 1043_1 extending toward the first source/drain region 101 and the second step 1043_2 extending toward the second source/drain region 103. The gate stack 104 thus formed may have reduced resistance.

Further, as shown in FIG. 11, the lower surface of the first step 1043_1 of the gate stack 104 formed is substantially parallel to the interface between the material layer forming the channel region 102 and the material layer forming the first source/drain region 101, and the upper surface of the second step 1043_2 is substantially parallel to the interface between the material layer forming the channel region 102 and the material layer forming the second source/drain region 103. Based on the self-alignment of the first spacer 105_1 and the second spacer 105_2 with the channel region 102, the gate stack 104 can also achieve self-alignment with the channel region 102, thereby improving the manufacturing accuracy of the device. In addition, a work function adjustment layer may be further formed between the gate dielectric layer 1041 and the gate conductor layer 1042, which is not repeated here.

Figure 12:
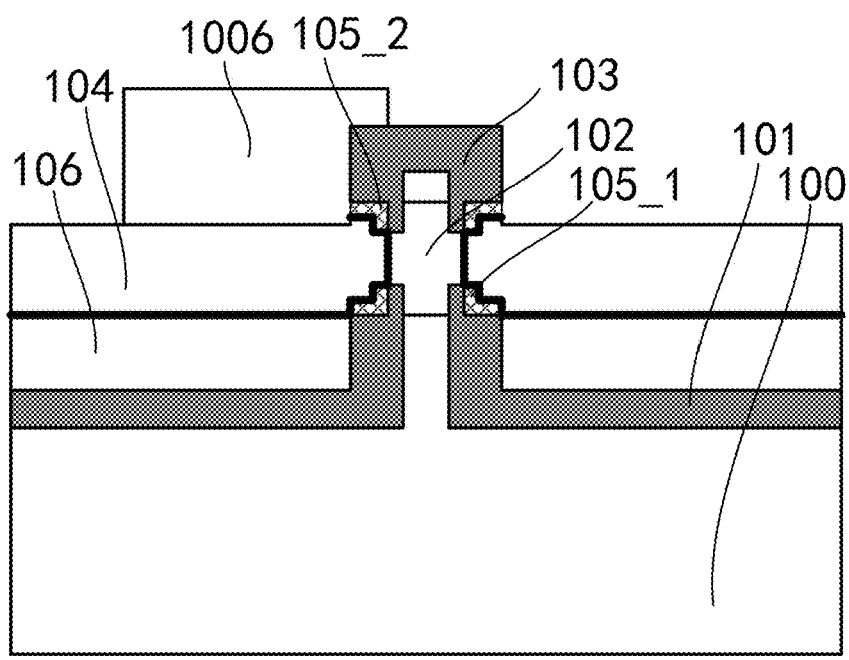
Figure 13:
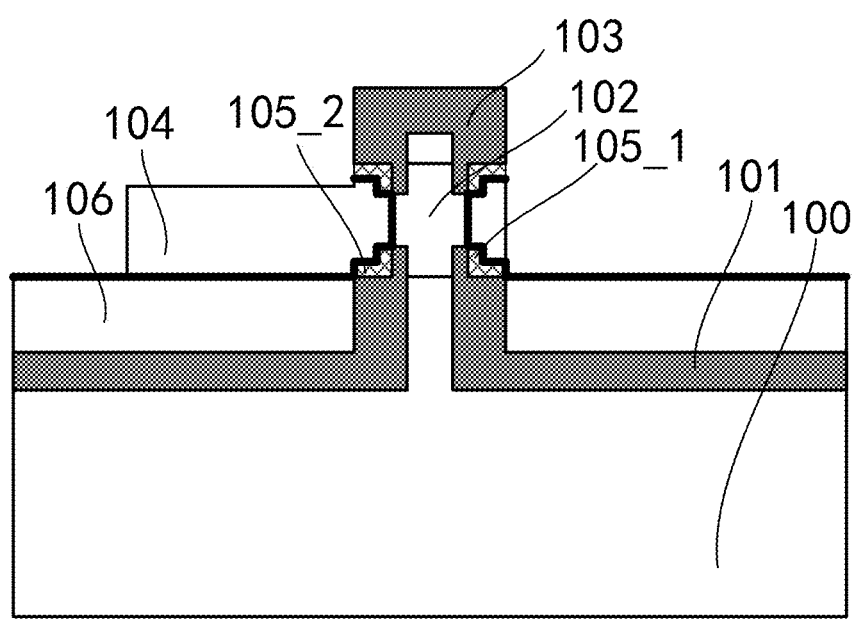

Next, the shape of the gate stack 104 may be adjusted to facilitate subsequent interconnection production. As shown in FIG. 12, according to an embodiment, the photoresist 1006 may be formed on the structure shown in FIG. 11. The photoresist 1006 is patterned, for example, by photolithography, to cover a portion of the gate stack 104 exposed outside the recess (in this example, the left half in the figure), and also the other portion of the gate stack 104 exposed outside the recess (in this example, the right half in the figure). Then, the selective etching such as RIE may be performed on the gate stack 104 by using the photoresist 1006 as a mask. In this way, in addition to the portion of the gate stack 104 remaining in the recess, the portion of the gate stack 104 covered by the photoresist 1006 is also retained, as shown in FIG. 13. Subsequently, the electrical connection to the gate stack 104 may be achieved through this portion. After the etching is completed, the photoresist 1006 is removed.

Next, referring back to FIG. 1A, the interlayer dielectric layer 107 is formed on the structure shown in FIG. 13. For example, an oxide may be deposited and a planarization such as CMP may be performed on the deposited oxide to form the interlayer dielectric layer 107. In the interlayer dielectric layer 107, the contacts 108_2 and 108_3 to the first and second source/drain regions 101 and 103 and the contact 108_1 to the gate stack 104 may be formed respectively. These contacts may be formed by forming via holes by etching in the interlayer dielectric layer 107 and the isolation layer 106 and filling the via holes with conductive materials such as metal.

Since the gate stack 104 extends beyond the outer periphery of the active region, the contact 108_1 may be easily formed. In addition, since the lower portion of the first source/drain region 101 extends beyond the outer periphery of the columnar active region, that is, there is no gate stack 104 at least over a portion of the first source/drain region 101, the contact 108_2 may be easily formed.

The semiconductor device according to the embodiments of the present disclosure is applicable to various electronic devices. For example, by integrating a plurality of such semiconductor devices and other devices (for example, other forms of transistors, etc.), it is possible to form an integrated circuit (IC) and thereby construct an electronic device. Therefore, the present disclosure further provides an electronic device including the above-mentioned semiconductor device. The electronic device may further include components such as a display screen matched with the integrated circuit and a wireless transceiver matched with the integrated circuit. Such electronic device includes smart phone, computer, tablet computer (PC), wearable smart device, mobile power supply, and so on.

In the above description, the technical details such as patterning and etching of each layer have not been described in detail. However, those skilled in the art should understand that various technical means may be used to form layers, regions, etc. of desired shapes. In addition, in order to form the same structure, those skilled in the art may also design a method that is not completely the same as the method described above. In addition, although the respective embodiments are described above separately, this does not mean that the measures in the respective embodiments cannot be advantageously used in combination.

The embodiments of the present disclosure have been described above. However, these embodiments are for illustrative purposes only, and are not intended to limit the scope of the present disclosure. The scope of the present disclosure is defined by the appended claims and their equivalents. Without departing from the scope of the present disclosure, those skilled in the art can make various substitutions and modifications, and these substitutions and modifications should all fall within the scope of the present disclosure.

The invention claimed is:

1. A semiconductor device, comprising:
a substrate;
a first source/drain region, a channel region and a second source/drain region stacked sequentially on the substrate and adjacent to each other; and
a gate stack formed around an outer periphery of the channel region, wherein the gate stack comprises a gate conductor layer and a gate dielectric layer;
wherein the gate stack has a thickness varying in a direction perpendicular to a top surface of the substrate;
wherein a first spacer is provided between the gate stack and the first source/drain region, and a second spacer is provided between the gate stack and the second source/drain region;
wherein the thickness of the gate stack increases in a direction parallel to the top surface of the substrate from an interface between the gate stack and the channel region to an outer periphery of the first spacer or the second spacer; and
wherein the gate stack has a first step extending toward the first source/drain region, and the gate stack has a second step extending toward the second source/drain region.

2. The semiconductor device according to claim 1, wherein the first spacer covers the first step so as to completely separate the gate stack from the first source/drain region, and the second spacer covers the second step so as to completely separate the gate stack from the second source/drain region.

3. The semiconductor device according to claim 1, wherein the first spacer and the second spacer are conformally formed on the first step and the second step respectively.

4. The semiconductor device according to claim 1, wherein the first spacer and the second spacer respectively have a first inner side surface and a second inner side surface substantially coplanar with the interface between the gate stack and the channel region.

5. The semiconductor device according to claim 4, wherein a doped region of the first source/drain region and a doped region of the second source/drain region extend along an outer surface of the first source/drain region and an outer surface of the second source/drain region respectively.

6. The semiconductor device according to claim 5, wherein a portion of the doped region of the first source/drain region and a portion of the doped region of the second source/drain region overlap respectively the channel region; in the direction parallel to the top surface of the substrate, a distance from an interface between the doped region of the first source/drain region and the channel region to another interface between the doped region of the first source/drain region and the channel region is less than a distance between first inner side surfaces, and a distance from an interface between the doped region of the second source/drain region and the channel region to another interface between the doped region of the second source/drain region and the channel region is less than a distance between second inner side surfaces; and in the direction perpendicular to the top surface of the substrate, a distance from the interface between the doped region of the first source/drain region and the channel region to an interface between the doped region of the second source/drain region and the channel region is equal to or less than a minimum thickness of the gate stack determined by the interface between the gate stack and the channel region.

7. The semiconductor device according to claim 1, wherein a lower surface of the first step is substantially parallel to an interface between a material layer forming the channel region and a material layer forming the first source/drain region, and/or an upper surface of the second step is substantially parallel to an interface between the material layer forming the channel region and a material layer forming the second source/drain region.

8. The semiconductor device according to claim 1, wherein a lower surface of the first spacer is substantially coplanar with an interface between a material layer forming the channel region and a material layer forming the first source/drain region, and/or an upper surface of the second spacer is substantially coplanar with an interface between the material layer forming the channel region and a material layer forming the second source/drain region.

9. The semiconductor device according to claim 1, wherein the spacers are formed of a material with a low dielectric constant.

10. The semiconductor device according to claim 1, wherein the channel region comprises a single crystal semiconductor material.

11. The semiconductor device according to claim 1, wherein a semiconductor material of the channel region is different from a semiconductor material of the first source/drain region and/or the second source/drain region.

12. An electronic device, comprising an integrated circuit formed by the semiconductor device according to claim 1.

13. The electronic device according to claim 12, wherein the electronic device comprises a smart phone, a computer, a tablet computer, an artificial intelligence device, a wearable device, or a mobile power supply.

* * * * *